SCR RING COUNTER HAVING SWITCHING MEANS TO SELECTIVELY ELIMINATE STAGE FROM COUNTING SEQUENCE

Filed Feb. 13, 1967

INVENTORS
R. W. MICHAEL
G. T. PORTER
BY
Young & Quigg
ATTORNEYS

INVENTORS
R. W. MICHAEL
G. T. PORTER
BY
Young & Quigg
ATTORNEYS

United States Patent Office 3,432,684
Patented Mar. 11, 1969

3,432,684

SCR RING COUNTER HAVING SWITCHING MEANS TO SELECTIVELY ELIMINATE STAGE FROM COUNTING SEQUENCE

Richard W. Michael and Grady T. Porter, Bartlesville, Okla., assignors to Phillips Petroleum Company, a corporation of Delaware Filed Feb. 13, 1967, Ser. No. 615,643
U.S. Cl. 307—223 10 Claims
Int. Cl. H03k *21/30, 23/08, 23/22*

ABSTRACT OF THE DISCLOSURE

A SCR (silicon controlled rectifier) ring counter is provided with switching means to selectively omit any of the stages from the operation of the counter. An initiating circuit provides a pulse to start operation with a particular stage. Each stage of the counter is provided with a voltage divider and a scaling resistor to provide an identification signal to a recorder. A diode is connected in parallel with the inductive load of each SCR to prevent any inductive kick on turn-off. An RC circuit is connected in parallel with each inductive load to provide for an initial current flow while the current through the inductive load builds up.

*Background of the invention*

This invention relates to electrical apparatus for producing control signals in sequence. In one aspect the invention relates to electrical apparatus for controlling a plurality of elements in sequence wherein means are provided to selectively eliminate one or more of the elements from the sequence.

Ring counters employing silicon controlled rectifiers are well known in the art. However, such counters are inflexible in that a fixed number of stages are employed in any given counter, and there is no provision for selectively eliminating one or more of the stages. Upon startup and on restart after a power failure, the initial firing stage would vary randomly. Difficulties were also encountered when employing an inductive load from inadequate initial current to maintain the silicon controlled rectifier (SCR) in a conducting state and from inductive kick upon cutoff of the SCR.

In accordance with the present invention it has been discovered that some of the foregoing disadvantages of the prior art counters can be avoided by providing means for selectively removing one or more of the stages of the counter. This enables the improved counter to be utilized in sequential control systems wherein it is desirable to be able to select which of several elements are to be actuated. Additional difficulties are avoided by the use of a diode in parallel with each inductive load to suppress inductive kick, and by the use of an RC network in parallel with the inductive load to permit a sufficiently high initial current.

Accordingly, it is an object of the invention to provide a new and improved ring counter which is suitable for use as a control device. Another object of the invention is to provide an electrical control system for selectively actuating a plurality of elements in sequence. Another object of the invention is to provide a ring counter which commences operation with a particular stage each time the counter is started. Yet another object of the invention is to provide means for recording a signal indicative of which stage of a ring counter is being actuated.

Other objects, aspects and advantages of the invention will be apparent from a study of the specification, the drawing and the appended claims to the invention.

*Description of the preferred embodiment*

Figure 1A:
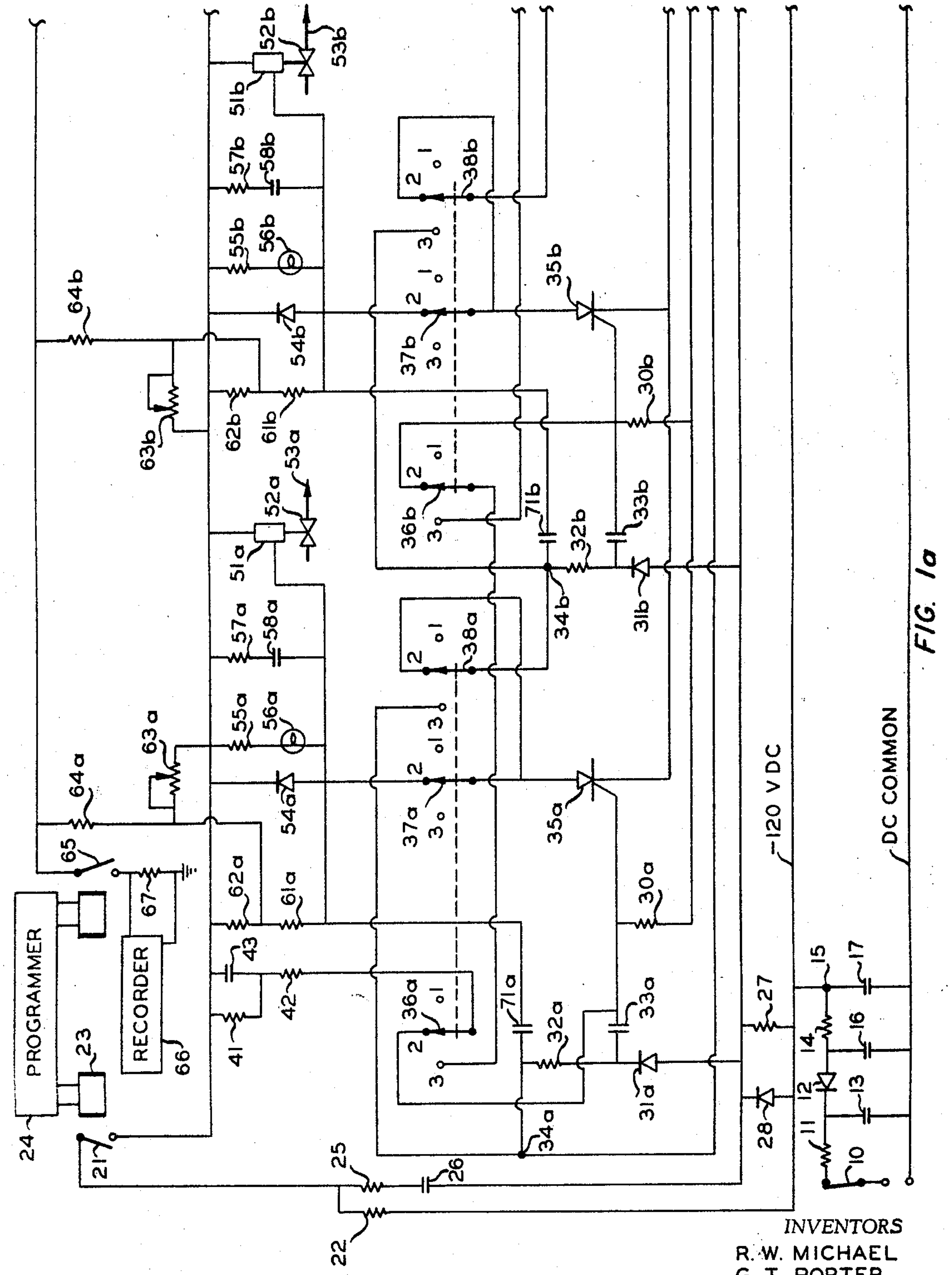
FIGURES 1*a* and 1*b* of the drawing constitute a schematic representation of a four-stage counter in accordance with the invention for selectively operating various valves in response to programmed signals and the internal settings of the counter.
Figure 1B:
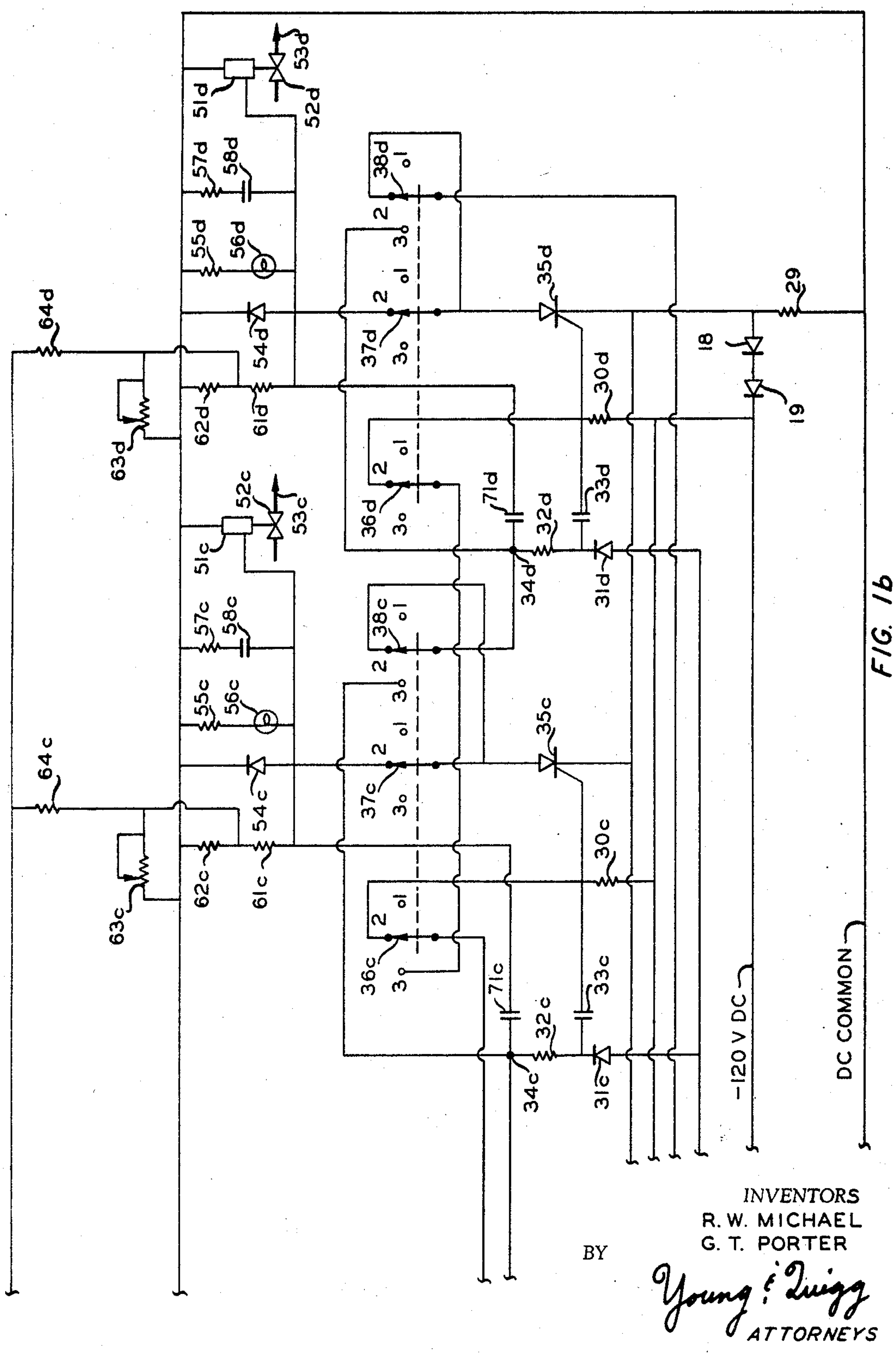

Referring now to the drawing in detail, on-off switch 10 and resistor 11 are connected in series between ACH (A.C. hot) and the cathode of rectifier 12. Capacitor 13 is connected between ACN (A.C. neutral), which also serves as the D.C. common, and the cathode of rectifier 12. Resistor 14 is connected between the anode of rectifier 12 and terminal 15. Capacitor 16 is connected between ACN and the anode of rectifier 12 while capacitor 17 is connected between ACN and terminal 15. The foregoing network serves as a power supply to furnish −120 volts D.C. at terminal 15 with respect to the D.C. common.

Normally open programmer switch 21 and load resistor 22 are connected in series between D.C. common and terminal 15. Switch 21 is actuated to a closed position by relay 23 responsive to the output of a programmer or other suitable time means 24. Resistor 25, capacitor 26 and resistor 27 are connected in series between switch 21 and terminal 15 to form a differentiating network. The anodes of each of gating diodes 31*a*, 31*b*, 31*c* and 31*d* are connected to the junction between capacitor 26 and resistor 27. The closing of switch 21 causes capacitor 26 to charge and applies a positive gating pulse to the anodes of diodes 31*a*, 31*b*, 31*c* and 31*d*. The cathode of diode 28 is connected to the junction between capacitor 26 and resistor 27, while the anode of diode 28 is connected to terminal 15. Diode 28 serves as a clamp to keep the voltage pulse from going negative and to help discharge capacitor 26 upon the opening of switch 21. As the basic elements of each of the stages of the counter are the same, the corresponding elements are labelled with the same numeral followed by the letter designation *a*, *b*, *c* or *d* corresponding to the first, second, third and fourth stages, respectively. For sake of simplicity, the description will be in terms of the first stage, making reference to the other stages only when desirable.

Resistor 32*a* and capacitor 33*a* are connected in series between terminal 34*a* and the gate terminal of silicon controlled rectifier 35*a*. The cathode of gating diode 31*a* is connected to the junction between resistor 32*a* and capacitor 33*a*. Resistor 30*a* is connected between the gate terminal of silicon controlled rectifier (SCR) 35*a* and terminal 15. The cathode of SCR 35*a* is connected to the anode of diode 18. The cathode of diode 18 is connected to the anode of diode 19, while the cathode of diode 19 is connected to terminal 15. Diodes 18 and 19, along with resistor 29 supplying current, provide a biasing voltage between the cathode and gate terminal of SCR 35*a* to serve as a threshold voltage which must be overcome before the SCR 35*a* will fire. This prevents noise or undesired transients from causing an accidental firing of SCR 35*a*.

During operation of the counter, all of capacitors 33*a*, 33*b*, 33*c*, and 33*d*, except for the one corresponding to the stage following the conducting stage, will have a negative charge on the terminal connected to the SCR gate terminal and a positive charge on the opposite terminal of the capacitor, as will be explained more fully hereinafter. This charge is sufficient to back bias the respective one of gating diodes 31*a*, 31*b*, 31*c* and 31*d*, so that only the gating diode corresponding to the stage following the conducting stage can pass the gating pulse from the differentiating circuit. For example, if SCR 35*b* is conducting and all of the stages are being utilized, capacitors 33*a*, 33*b* and 33*d* are charged with a negative charge on the terminal common to the gate terminal of SCR 35*a*, SCR 35*b* and SCR 35*d*, respectively, and with a positive charge on the terminal common to the cathode of diodes 31*a*, 31*b* and 31*d*, respectively. Capacitor 33*c* is discharged. Diodes 31*a*, 31*b* and 31*d* are thus back biased and can not pass the gating pulse. Diode 31*c* does pass the gating pulse to fire SCR 35*c*.

Switches 36*a*, 37*a* and 38*a* have three positions each and are mechanically interconnected or ganged. The #1 position of all of the ganged switches corresponds to "off" while the #2 and #3 positions correspond to "on" and "skip," respectively. Switches 36*a*, 36*b*, 36*c* and 36*d* can be termed the initiating pulse switches, switches 37*a*, 37*b*, 37*c* and 37*d* can be termed the load switches, and switches 38*a*, 38*b*, 38*c* and 38*d* can be termed the cutoff switches. As will be subsequently described, when a ganged set of switches for any stage is in the "skip" position, that stage will not be actuated during operation of the counter. If any ganged set of switches is in the "off" position, the cycling will stop at the preceding stage and the preceding stage will remain on until the switches for the following stage are moved to "on" or "skip." When a ganged set of switches is in the "on" position, that stage is actuated in its proper sequence. The #1 position terminals on all of the ganged switches and the #3 position terminals of switches 37*a*, 37*b*, 37*c*, 37*d* and 38*d* are blank or unused terminals.

High impedance resistor 41 and low impedance resistor 42 are connected in series between D.C. common and the contactor of switch 36*a*. Capacitor 43 is connected in parallel with resistor 41. The #2 terminal of swtich 36*a* is connected to the gate terminal of SCR 35*a*. The initiating pulse is produced as a one-shot signal upon the power supply being actuated by closing switch 10 after placing at least one of the ganged set of switches in the "on" position. Resistor 41 is considerably larger than resistor 42, so that the initially positive-going pulse produced by the charging of capacitor 43 at the gate electrode of the SCR in the stage which is the first one in "on" position upon closing of switch 10, is returned to a steady state negative value closely approximating the power supply voltage of −120 v. D.C. The positive-going initiating pulse is sufficient to fire the SCR while the steady state value is insufficient to overcome the threshold bias voltage produced by diodes 18 and 19 and the threshold of the SCR itself. Resistor 41 provides a discharge path for capacitor 43 when the power supply is turned off.

The #2 terminal of switch 36*a* is connected to the gate terminal of SCR 35*a*, which the #3 terminal of switch 36*a* is connected to the contactor of switch 36*b*. Similarly the "on" terminals of switches 36*b*, 36*c* and 36*d* are connected to the gate terminal of SCR's 35*b*, 35*c* and 35*d*, respectively, while the "skip" terminals of switches 36*b* and 36*c* are connected to the contactor of the initiating pulse switch of the next following stage, i.e., the contactor of switches 36*c* and 36*d*, respectively. Thus, if switch 36*a* is in the "on" position, the initiating pulse is applied to the gate terminal of SCR 35*a*, but if switch 36*a* is in the "skip" position, the initiating pulse is applied to the gate terminal of SCR 35*b*, or if switch 36*b* is also in the "skip" position, to the gate terminal of the SCR of the next succeeding stage which is not being skipped.

The anode of SCR 35*a* is connected to the contactor of switch 37*a*. The solenoid coil 51*a* of a solenoid actuated valve 52*a* located in a process pipe 53*a*, is connected between the #2 terminal of switch 37*a* and D.C. common. When SCR 35*a* conducts, current passes through coil 51*a* to actuate valve 52*a*. The diode 54*a* is connected in parallel with coil 51*a* with the anode of diode 54*a* being connected to the #2 terminal of switch 37*a*. Diode 54*a* suppresses any inductive voltage kick of solenoid coil 51*a* upon SCR 35*a* cutting off. Resistor 55*a* and pilot light 56*a* are connected in series with each other across the terminals of solenoid coil 51*a* to provide a visual indication of which of the valves under control is being actuated at the moment. Resistor 57*a* and capacitor 58*a* are also connected in series between the terminals of solenoid coil 51*a* to act as a surge circuit to provide initial current through SCR 35*a* upon firing of SCR 35*a* to maintain SCR 35*a* conducting for a sufficient time for the current through the solenoid coil 51*a* to build up to the holding current level of the SCR.

Resistors 61*a* and 62*a* are connected in series between the #2 terminal of switch 37*a* and D.C. common, and thus in parallel with solenoid coil 51*a*, to form a voltage divider. Variable resistor 63*a* is connected in parallel with resistor 62*a* to permit the compensation of the voltage divider for any undesirable variations, for example any loading effects on the power supply from using multiple solenoids on one or more of the SCR's. A resistor 64*a* is connected between one terminal of marker bar recording switch 65 and the junction between resistors 61*a* and 62*a*. The other terminal of switch 65 is connected to an input of recorder 66 and through resistor 67 to ground. Resistors 64*a*, 64*b*, 64*c* and 64*d* have individual resistance values different from each other to provide marker pulses of different amplitude to thus identify the valve being actuated. Switch 65 is actuated by programmer 24 to cause recorder 66 to record or display the marker pulses at the desired times.

Capacitor 71*a* is connected between the #2 terminal of switch 37*a* and terminal 34*a*. The contactor of switch 38*a* is connected to terminal 34*b*, and similarly the contactor of switch 38*d* is connected to terminal 34*a*. The #3 terminal of switch 38*a* is connected to terminal 34*a*, while the #2 terminal of switch 38*a* is connected to the anode of SCR 35*a*. Capacitor 71*a* is thus connected between the anodes of SCR 35*a* and SCR 35*d* when stages *a* and *d* are on. Similarly, capacitors 71*b*, 71*c* and 71*d* are connected between the anodes of adjacent pairs of SCR 35*a* and SCR 35*b*, SCR 35*b* and SCR 35*c*, and SCR 35*c* and SCR 35*d*, respectively, when the ganged switches for the respective tags are in the "on" position, illustrated in the drawing. Capacitors 71*a*, 71*b*, 71*c* and 71*d* act as cutoff capacitors to provide the means necessary to cut off a stage upon the firing of the next following stage. Assume that SCR 35*b* is conducting and SCR's 35*a*, 35*c* and 35*d* are off. The voltage on the anodes of SCR's 35*a*, 35*c* and 35*d* is essentially that of D.C. common, whereas the voltage on the anode of SCR 35*b* is very close to −120 volts D.C. as the voltage drop across SCR 35*b* in the conducting state is generally less than 1 volt and the voltage drop across diodes 37 and 38 is also small. Capacitor 71*b* will have a positive charge on the terminal connected to the anode of SCR 35a and a negative charge on the terminal connected to the anode of SCR 35*b*. Capacitor 71*c* will have a positive charge on the terminal connected to the anode of SCR 35*c* and a negative charge on the terminal connected to the anode of SCR 35*b*. Capacitors 71*a* and 71*d* will not have a charge thereon as both terminals are, at the same potential. When SCR 35*c* is fired, the voltage on the anode of SCR 35*c* drops to the normal negative value approaching −120 volts D.C. encountered with a conducting SCR. However, the voltage on the anode of SCR 35*b* is instantaneously driven below the normal "on" voltage at the anode of SCR 35*c* by the charge on capacitor 71*c*. The charge on capacitor 71*c* is sufficient to drive the anode voltage more negative than the cathode voltage and thus remove the forward bias on SCR 35*b* and/or reduce the current through SCR 35*b* to a value below the holding current for a sufficient length of time to return SCR 35*b* to the nonconducting state. When SCR 35*b* is cut off, the voltage on the anode of SCR 35*b* goes to that of the D.C. common, producing through switch 38*b* and terminal 34*c* a positive charge on the diode terminal of capacitor 33*c*, thus assisting in maintaining a gating pulse on the gate terminal of SCR 35*c*.

When SCR 35*b* is conducting, the voltage on the anode of SCR 35*b* closely approaches the voltage on the gate terminal of SCR 35*c*, thus causing capacitor 33*c* to discharge, enabling the passage of the next gating pulse through diode 31*c* to the gate terminal of SCR 35*c*. Capacitor 33*d* is charged to back bias diode 31*d* due to the voltage at the anode of SCR 35*c* being positive relative to the voltage at the gate terminal of SCR 35*d*. Capacitors 33*a* and 33*b* are similarly charged to back bias diodes 31*a* and 31*b*. When SCR 35*c* is fired by the next gating pulse, capacitor 33*d* is discharged to enable gating diode 31*d*, and capacitor 33*c* is charged to disable gating diode 31*c*, with capacitors 33*a* and 33*b* remaining charged to disable gating diodes 31*a* and 31*b*. Thus, the occurrence of each gating pulse fires the next succeeding SCR and turns off the previously conducting SCR.

The counter circuit of the invention provides for the sequential actuation of all or only selected ones of valves 52*a*, 52*b*, 52*c* and 52*d*. While the invention has been described in terms of utilizing four stages, it is within the contemplation of the invention to utilize a fewer number or a greater number of stages. When it is desired to omit the actuation of a particular valve, the corresponding ganged set of switches is turned to the "skip" position, thus effectively removing that stage of the counter while connecting the next following stage being operated to the next preceding stage being operated. Any combination of the stages can be skipped.

The invention is particularly applicable to being employed in combination with a single chromatograhpic analyzer for sampling a plurality of process streams. The invention utilizes solid state components and does not require any devices which are subject to arcing. The ganged set of switches can be formed from any suitable explosion-proof switch, for example the Daven Sub-Miniature Switch/series G, manufactured by Thomas A Edison Industries. While the invention has been illustrated as utilizing an anode coupled counter, it is within the contemplation of the invention to utilize a cathode coupling.

Reasonable variations and modifications are possible within the scope of the foregoing disclosure, the drawing and the appended claims to the invention.

We claim:

1. Electrical control apparatus comprising (1) a plurality of stages arranged in circular series.

each of said stages comprising a silicon controlled recifier having an anode, a cathode and a gate terminal, a first resistor and a first capacitor connected in series between a second terminal and said gate terminal, a gating diode having an anode and a cathode, means for connecting said cathode of said gating diode to the junction between said first resistor and said first capacitor, a second resistor having a first end and a second end, means for connecting said first end of said second resistor to said gate terminal of said silicon controlled rectifier, a second capacitor connected between said anode of said silicon controlled rectifier and said second terminal; and a load means connected between said anode of said silicon controlled rectifier and a third terminal;

(2) a source of D.C. voltage having a positive terminal and a negative terminal, means for connecting said positive terminal of said source of D.C. voltage to said third terminal of each of said stages, means for connecting said negative terminal to said second end of said second resistor of each of said stages, means for connecting said negative terminal to said cathode of said silicon controlled rectifier of each of said stages; (3) means for applying individual pulses to said anode of said gating diode of each of said stages; wherein the improvement comprises means associated with each of said stages for selectively connecting the second terminal of the respective stages to the anode of the silicon controlled rectifier of one of the preceding stages in the circular series, whereby any combination of said stages can be skipped during the operation of said plurality of stages.

2. Apparatus in accordance with claim 1 wherein the improvement further comprises initiating means for producing an initiating pulse, and means for selectively connecting said initiating means between said positive terminal of said source of D.C. voltage and the gate terminal of one of the silicon controlled rectifiers.

3. Apparatus in accordance with claim 2 wherein said initiating means and said means for selectively connecting said initiating means comprise switching means for selectively connecting an input terminal to one of the gate terminals of said silicon controlled rectifiers, a third resistor and a third capacitor connected in series between said input terminal of said switching means and said positive terminal of said source of D.C. voltage, and a fourth resistor connected in parallel with said third capacitor.

4. Apparatus in accordance with claim 1 wherein said load means comprises an inductance coil having means associated therewith to be actuated by the energization of said inductance coil.

5. Apparatus in accordance with claim 4 wherein the improvement further comprises each stage containing a diode connected in parallel with said inductance coil to suppress the inductive kick of the respective inductance coil when the corresponding silicon controlled rectifier is rendered nonconducting.

6. Apparatus in accordance with claim 4 wherein the improvement further comprises each stage containing a fifth resistor and a fourth capacitor connected in series between the ends of said inductance coil to provide for the initial flow of current upon the firing of the corresponding silicon controlled rectifier while the current through the inductance coil builds up.

7. Apparatus in accordance with claim 1 wherein said load means comprises a solenoid valve having its solenoid coil connected between the anode of the respective silicon controlled rectifier and the respective third terminal, and wherein the improvement further comprises each stage containing a diode connected in parallel with said solenoid coil to suppress the inductive kick of the solenoid coil to provide for the initial flow of current upon the firing of the corresponding silicon controlled rectifier while the current through the solenoid coil builds up.

8. Apparatus in accordance with claim 7 wherein the improvement further comprises a recorder, and each stage containing a sixth resistor and a seventh resistor connected between the anode of the silicon controlled rectifier and the corresponding third terminal, and an eighth resistor connected between an input to said recorder and the junction between said sixth and seventh resistors, each of the eighth resistors having a different value to provide a voltage characteristic of the stage which is conducting.

9. Apparatus in accordance with claim 1 wherein the improvement further comprises a recorder, and each stage containing a third resistor and a fourth resistor connected between the anode of the silicon controlled rectifier and the corresponding third terminal, and a fifth resistor connected between an input to said recorder and the junction between said third and fourth resistors, each of the fifth resistors having a different value to provide a voltage characteristic of the stage which is conducting.

10. Apparatus in accordance with claim 1 wherein said means for selectively connecting the second terminal of the respective stage to the anode of the silicon controlled rectifier of one of the preceding stages is provided with an explosion-proof housing.

References Cited

UNITED STATES PATENTS

| | | | |
|---|---|---|---|
| 3,217,185 | 11/1965 | Jansons | 307—223 |
| 3,368,083 | 2/1968 | Dowding et al. | 307—223 X |
| 3,370,178 | 2/1968 | Risberg | 307—223 |

JOHN S. HEYMAN, *Primary Examiner.*

U.S. Cl. X.R.

307—305